United States Patent
Chan et al.

(10) Patent No.: US 8,248,869 B1
(45) Date of Patent: Aug. 21, 2012

(54) CONFIGURABLE MEMORY MAP INTERFACE AND METHOD OF IMPLEMENTING A CONFIGURABLE MEMORY MAP INTERFACE

(75) Inventors: Chi Bun Chan, San Jose, CA (US); Jingzhao Ou, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 399 days.

(21) Appl. No.: 12/581,099

(22) Filed: Oct. 16, 2009

(51) Int. Cl.
*G11C 7/00* (2006.01)

(52) U.S. Cl. ... 365/191; 365/194; 365/193; 365/189.14; 365/230.05

(58) Field of Classification Search ............... 365/191, 365/194, 193, 189.14, 230.05
See application file for complete search history.

(56) References Cited

U.S. PATENT DOCUMENTS

| | | | | |
|---|---|---|---|---|
| 5,615,358 | A | * | 3/1997 | Vogley .......................... 713/501 |
| 6,452,869 | B1 | * | 9/2002 | Parker ......................... 365/238.5 |
| 2002/0013881 | A1 | * | 1/2002 | Delp et al. .................... 711/105 |

OTHER PUBLICATIONS

Xilinx, Inc., Paththavong et al., Application Note: Video Frame Buffer Controller, Virtex 5 Family, "Integrating a Video Frame Buffer Controller (VFBC) in System Generator", XAPP 1136 (v1.0), Jun. 1, 2009, Xilinx, Inc., 2100 Logic Drive, San Jose, California.
Xilinx, Inc., System Generator for DSP "System-Level Modeling in System Generator", Rel. 10.1, Mar. 2008, 20 pages, Xilinx, Inc., 2100 Logic Drive, San Jose, California.

* cited by examiner

*Primary Examiner* — Vu Le
*Assistant Examiner* — Han Yang
(74) *Attorney, Agent, or Firm* — John J. King

(57) ABSTRACT

A configurable memory map interface coupled to a circuit element having input/output ports is disclosed. The configurable memory map interface comprises an input coupled to receive an address enabling reading from or writing to the circuit element; a memory storing enable signal parameters, the enable signal parameters controlling timing of enable signals for the reading from or the writing to the circuit element; and an enable signal generator generating the enable signals enabling the reading from or the writing to the circuit element based upon the enable signal parameters stored in the memory. A method of implementing a configurable memory map interface is also disclosed.

19 Claims, 10 Drawing Sheets

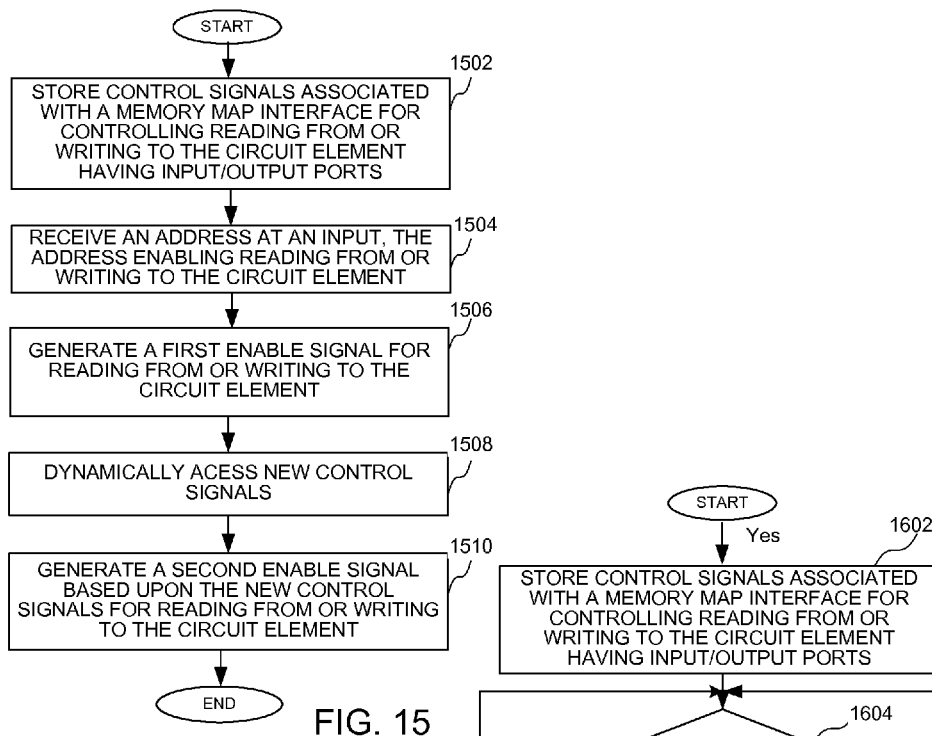
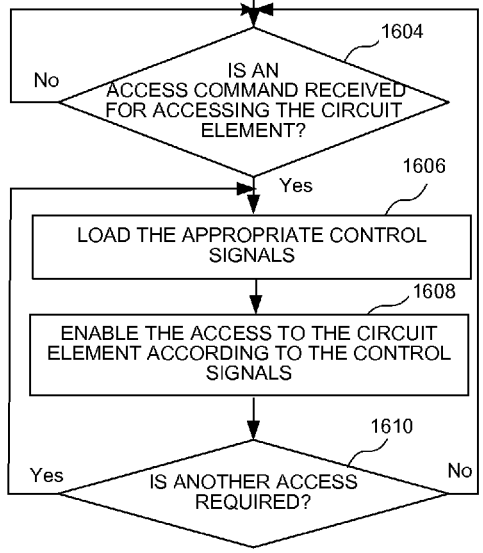
FIG. 15
FIG. 16

CONFIGURABLE MEMORY MAP INTERFACE AND METHOD OF IMPLEMENTING A CONFIGURABLE MEMORY MAP INTERFACE

FIELD OF THE INVENTION

The present invention relates generally to integrated circuits, and in particular, to a configurable memory map interface and a method of implementing a configurable memory map interface.

BACKGROUND OF THE INVENTION

Conventional tools exist for generating a high-level model that integrates co-processing with soft/hard processing and hardware co-simulation capability seamlessly into a simulation and modeling environment. Some tools address co-processing and hardware co-simulation by using memory-mapped input/outputs (I/Os). Memory-mapped I/Os provide a homogeneous interface to access input and output ports and shared memory blocks of a design by abstracting inputs/outputs with address spaces and memory read/write operations. In hardware co-simulation, a memory map interface couples a design to a co-simulation engine. In a co-processing arrangement, a memory map interface couples the design to a shared or dedicated bus of a processor. Each I/O port of the design is mapped to a specific region of a common address space. A port is associated with a memory location such that a write operation pushes a new value onto an input port and a read operation reads the current value from an output port. A shared memory block is mapped to a range of memory locations to enable burst read and write operations.

However, there are many challenges in providing a flexible mapping between a software simulation and an arbitrary design, and in providing a transparent integration between the co-processing/co-simulation machinery and varying I/O interfaces of different designs.

SUMMARY OF THE INVENTION

A configurable memory map interface coupled to a circuit element having input/output ports is disclosed. The configurable memory map interface comprises an input coupled to receive an address enabling reading from or writing to the circuit element; a memory storing enable signal parameters, the enable signal parameters controlling timing of enable signals for the reading from or the writing to the circuit element; and an enable signal generator generating the enable signals enabling the reading from or the writing to the circuit element based upon the enable signal parameters stored in the memory.

According to an alternate embodiment, a configurable memory map interface comprises an input coupled to receive an address enabling reading from or writing to the circuit element; a memory storing a mask, the mask controlling the reading from or the writing to the circuit element; and an enable signal generator generating an enable signal enabling the reading from or the writing to the circuit element based upon the mask stored in the memory.

A method of coupling a configurable memory map interface to a circuit element having input/output ports is also disclosed. The method comprises storing control signals for controlling reading from or writing to the circuit element; receiving an address at an input, the address identifying an input/output port of the circuit element for the reading from or the writing to the circuit element; generating a first enable signal for reading from or writing to the input/output port of the circuit element; dynamically accessing new control signals; and generating a second enable signal based upon the new control signals for reading from or writing to the input/output port of the circuit element.

BRIEF DESCRIPTION OF THE DRAWINGS

FIG. 15 is a flow chart showing a method of implementing a configurable memory map interface according to an embodiment of the present invention;

FIG. 16 is a flow chart showing a method of implementing a configurable memory map interface according to an alternate embodiment of the present invention;

DETAILED DESCRIPTION OF THE DRAWINGS

While memory mapping provides a useful interface for a circuit element having input/output ports, the circuits and methods for implementing a configurable memory map interface set forth below provide significant advantages. The circuits and methods may be applied in both a simulation environment, such as a simulation environment using co-simulation, as well as a co-processing environment. While the configurable memory map interfaces and methods set forth below may be implemented in a wide variety of applications, exemplary applications for implementing the configurable memory map interfaces are set forth in FIGS. 1-3.

Figure 1:
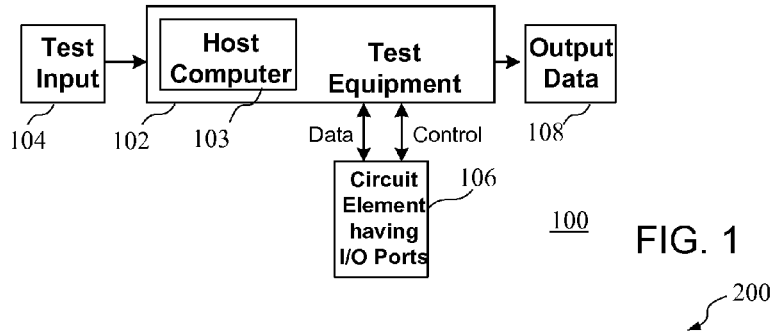
FIG. 1 is a block diagram of a system for testing an integrated circuit comprising a circuit having I/O ports according to an embodiment of the present invention.
Figure 2:
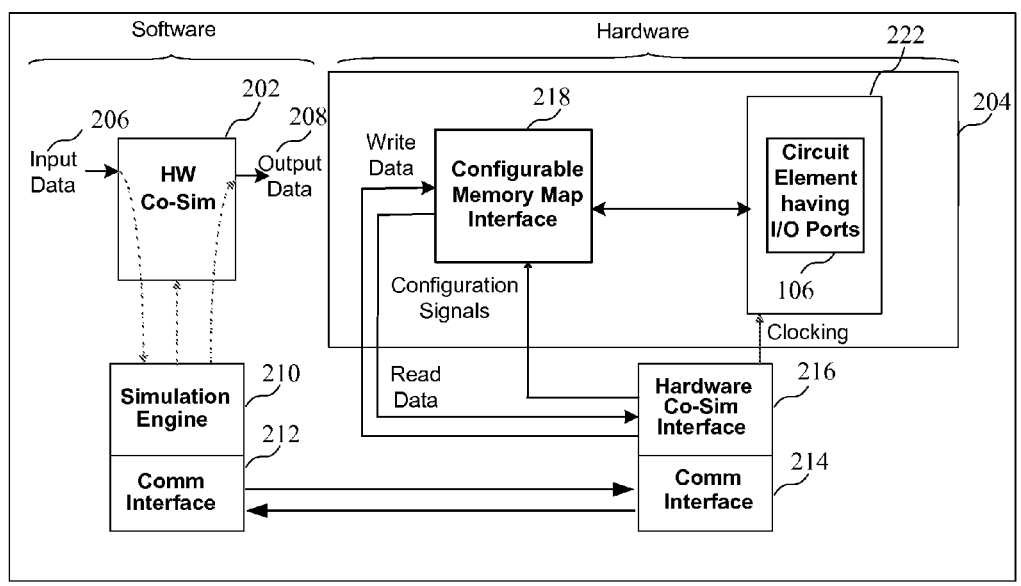
FIG. 2 is a block diagram of a system for enabling hardware co-simulation comprising a circuit element having I/O ports according to an embodiment of the present invention.

Turning first to FIG. 1, a block diagram of a system for testing an integrated circuit according to an embodiment of the present invention is shown. In particular, test equipment 102 having a host computer 103 receives a test input 104 comprising test data and/or configuration data for a circuit element having input/output (I/O) ports 106. The test equipment generates output data 108 based upon data received from the circuit element having I/O ports. The test equipment could employ a configurable memory map interface associated with a host computer for interacting with a circuit element having I/O ports. As will be described in more detail below, a circuit element having I/O ports may be a configurable circuit or a memory circuit, for example. The test equipment 102 couples data and control signal to and receives return data and control signals from the circuit element having I/O ports 106. The return data may comprise a test output from the circuit element provided to the test equipment. As part of the development process of a design which may be implemented in the circuit element 106, a test bench is often created to mimic the execution of the circuit in real situations. The test bench drives the circuit element 106 with certain input stimuli and compares the output results with some reference data. The test output will generally provide information verifying circuits of the circuit element 106. A more detailed example of a simulation system which may be implemented in the system of FIG. 1 is shown in FIG. 2. While FIG. 1 is described as a system for testing an integrated circuit, the elements of the system of FIG. 1 could be implemented in a system for enabling co-processing, as will be described in more detail in reference to FIG. 3.

Turning now to FIG. 2, a block diagram of a system 200 for enabling hardware co-simulation comprising a circuit element having I/O ports according to an embodiment of the present invention is shown. The system 200 has a hardware co-simulation portion 202 comprising software for interfacing with a hardware portion 204. The hardware co-simulation portion 202 receives input data 206 and generates output data 208, as will be described in more detail below. The hardware co-simulation portion 202 interfaces with a simulation engine 210. A communication interface 212 associated with the simulation engine 210 and a communication interface 214 enable communication with a hardware co-simulation interface 216. The various elements of the system 200 may be implemented according to the system 100, where the hardware portion 204 is coupled to the remaining portions of the system 200 implemented in the test equipment.

The hardware portion 204 comprises a configurable memory map interface 218 which is configured to receive write data from and generate read data to the hardware co-simulation interface 216. As will be described in more detail below, the configurable memory map interface 218 enables communication with a device 222 comprising the circuit element having I/O ports 106. The configuration memory map interface 218 receives configuration data which configures the interface according to the various embodiments of the invention. That is, the configurable memory map interface receives programming data and stores the appropriate data in memory locations for implementing the configurable memory map as desired. The hardware portion 204 may comprises a plurality of devices coupled to the device 222 comprising the circuit element 106, or may be a single device, such as an integrated circuit device having configurable resources as will be described in more detail in reference to FIGS. 13 and 14.

An example of a software tool for enabling hardware co-simulation as shown in FIG. 2 is the Xilinx System Generator for DSP (SysGen) available from Xilinx, Inc. of San Jose, Calif. SysGen provides hand-written simulation models and/or automatically generated C simulation models for basic hardware description blocks. For complicated intellectual property (IP) cores and user hardware description language (HDL) designs, SysGen integrates HDL simulators, such as ModelSim and ISE Simulator which are also available from Xilinx, Inc., for HDL co-simulation. Users may plug in their software simulation engines (e.g., transaction-level models) into SysGen to co-simulate the high-level models. The simulation on the hardware platform is controlled by a host computer of the test equipment, which coordinates data transfers between the software and hardware simulation engines. Hardware co-simulation is advantageous over software-based simulations for numerous reasons, including simulation acceleration, hardware debugging, and real-time verification. SysGen provides the automation for combining a device under test with appropriate co-simulation and communication interfaces, generates a hardware implementation of the design, and coordinates the co-simulation between the software and hardware environment.

Figure 3:
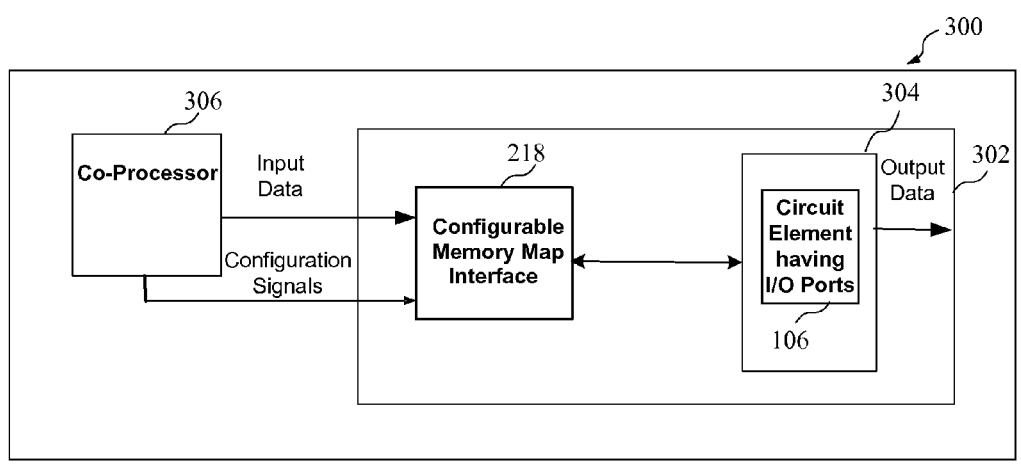
FIG. 3 is a system for enabling co-processing comprising a circuit element having I/O ports according to an embodiment of the present invention.

Turning now to FIG. 3, a system 300 for enabling co-processing comprising a circuit element having I/O ports according to an embodiment of the present invention is shown. The system 300 includes a circuit 302 comprising a circuit element having I/O ports 304 coupled to receive data from a co-processor 306. The circuit 302 is similar to the hardware portion 204. However, rather than being implemented in a co-simulation arrangement, the circuit 302 operates in any system implementing a co-processing arrangement which implements various circuit designs in the field. As set forth above with respect to FIG. 2, the system 300 may be arranged on a single integrated circuit or on a plurality of integrated circuits. For example, the system 300 may be implemented on a device having configurable resources, such as the device of FIG. 13, wherein at least a portion of the configurable memory map interface is implemented in one or more configurable logic elements and the co-processor 306 comprises a processor of the device. The co-processor 306 may be a hardware or software processor of the device. Alternatively, the circuit 302 may be implemented in a device such as the device of FIG. 13, where the co-processor 306 is a separate processor coupled to the device.

Figure 4:
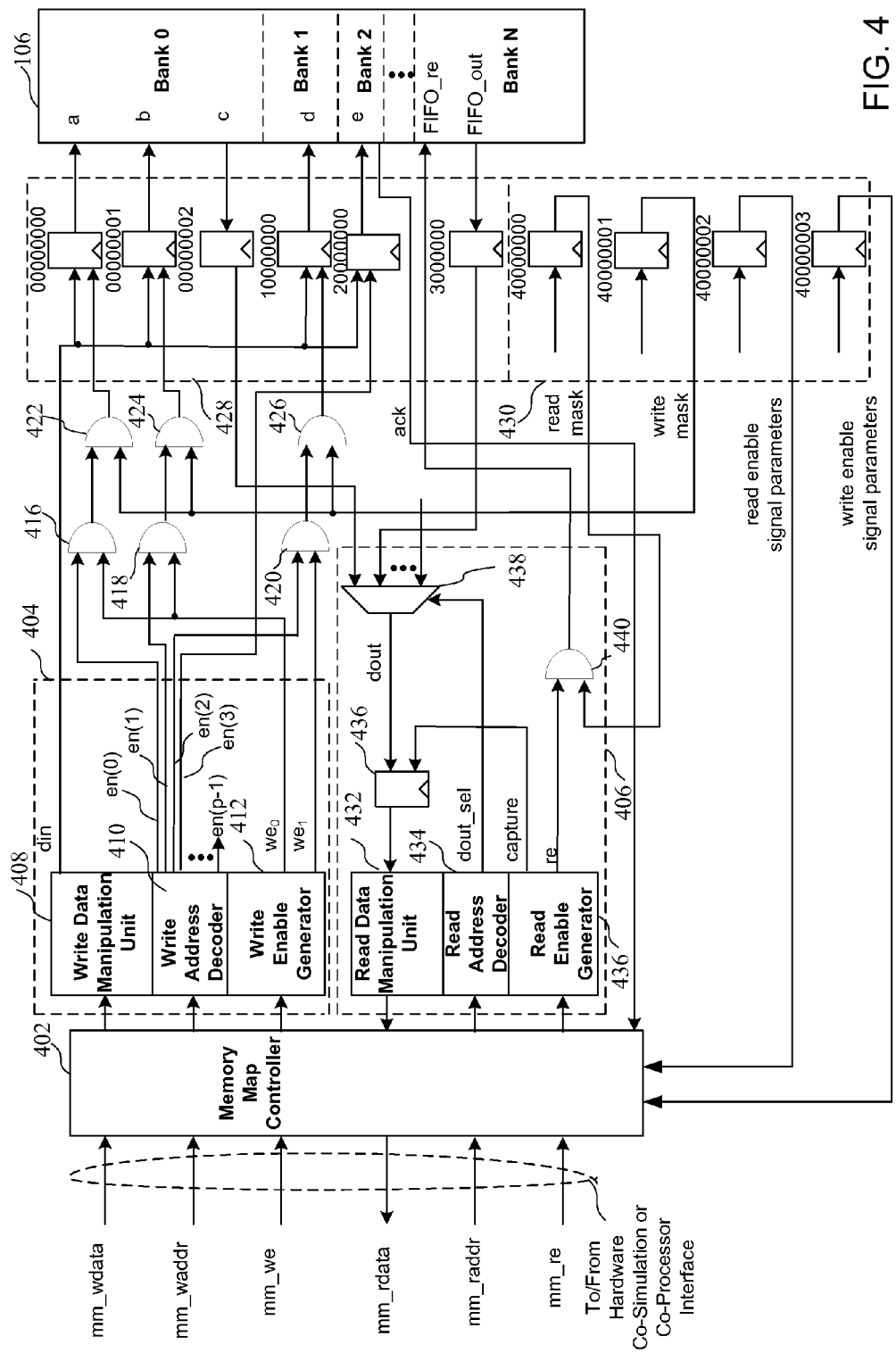
FIG. 4 is a block diagram of a configurable memory map interface according to an embodiment of the present invention.

Turning now to FIG. 4, a block diagram of a configurable memory map interface according to an embodiment of the present invention is shown. One side of the configurable memory map interface is coupled to an "upstream" hardware co-simulation or processor interface. For example, the coupling can be done through a processor local bus (PLB), for example, or a custom interface depending on the interface used by the hardware co-simulation engine or processor. The other side of the memory map interface is coupled to input/output ports of the device 106, where the interface varies based on the number of I/O ports and shared memory blocks in the design implemented in the device. In particular, the memory map controller 402 receives inputs from a hardware co-simulation engine or a co-processor interface, and couples the inputs to a write portion 404 or a read portion 406. A memory map controller 402 handles memory access requests such as read and write requests from an upstream device and controls various units of the write portion 404 and the read portion 406.

The write portion 404 of the configurable memory map interface comprises a write data manipulation unit 408 which supports bit masking and shifting operations on the incoming data (mm_wdata) before passing the data as input data (din) to the circuit element 106. That is, the write data manipulation unit 408 is coupled to receive memory map write data (mm_wdata) and generate input data (din). A write address decoder 410 is coupled to receive a memory map write address (mm_waddr) and generate write address enable signals (en(0) . . . en(p−1), where "p" represents the number of input/output ports of the device 106. The write address decoder decodes the memory write address and generates corresponding write address enable signals to select the particular port or shared memory of the circuit element to perform a write operation. As will be described in more detail below, the device 106 may comprise different banks, where the most significant bits of the address identify the bank.

The enable signals are provided to a gate which provides a logical conjunction with a write enable signal generated by the write enable generator 412 and the enable signal generated by the address decoder 410. In particular, en(0), en(1) and en(2) are provided to AND gates 416, 418 and 420, respectively, each of which also receives a write enable signal. As will be described in more detail below, the write enable signal is generated to according to stored enable signal parameters to generate a write enable signal of a certain shape. According to the embodiment of FIG. 4, a write enable signal $we_0$ is coupled to memory elements associated with input ports "a" and "b" of a Bank 0, while a second write enable signal $we_1$ is coupled to the memory element associated with an input port "d" of a Bank 1. The write enable signals output by the AND gates 416-420 are coupled to AND gates 422-426, which also receives a write mask. Therefore, in addition to generating a write enable signal having certain characteristics based upon stored enable signal parameters, the enable signals may be masked to enable selective reading and writing from ports.

The outputs of the AND gates 422-426 are coupled as enable signals to memory elements associated with predetermined ports. For example, the output of AND gate 422 is coupled to a memory element having an address 00000000 (designated in hexadecimal) of an I/O address space 428 which is associated with a port "a" of the device 106. Similarly, the output of AND gate 424 is coupled to a memory element having an address 00000001 which is associated with a port "b" of the device 106, while the output of AND gate 426 is coupled to a memory element having an address 10000000 which is associated with a port "d" comprising an output port of the device 106.

Accordingly, the configurable memory map interface is organized into portions comprising an addressable memory space having banks, where individual banks may be parameterized with different behavior for read and write transactions. As shown in FIG. 4, a first write enable signal $we_0$ is associated with two of the ports of a Bank 0, while a second write enable signal $we_1$ is associated with a third port, port "d", of Bank 1 to which data is written. As can been seen, the address location for the memory element associated with port "d" of a Bank 1 has different bank select value (i.e. the 1 in the most significant bit of the address). A Bank 2 is also coupled to an addressable memory element having an address 2000000. As can be seen, the memory element receives an enable signal (en(3)) which is not altered by a write enable signal or a write mask. However, as will be described in more detail below, an acknowledge signal (ack) is generated by the bank to indicate that the bank is able to receive more write data. While two write enable signals, $we_0$ and $we_1$, are shown in FIG. 4, any number of write enable signals may be generated for different ports, including a write enable signal for each port, where the write enable signal includes timing characteristics specific to that port.

A configuration space 430 also comprises addressable registers which store read and write masks and read enable signal and write enable signal parameters. The read enable signal and write enable signal parameters are used by the memory map controller to generate the appropriate read and write enable signals as will be described in reference to FIGS. 7-10. The configuration space is also preferably addressed by a bank select value which is different than the I/O address space, as will be described in more detail in reference to FIG. 6. The values stored in the memory elements of the address space and the configuration space may be programmed using configuration data as a part of the co-simulation operation for testing a circuit or for implementing a circuit in the field.

The read portion 406 of the configurable memory map interface comprises a read data manipulation unit 432, a read address decoder 434, and a read enable generator 436. The read data manipulation unit 432 is coupled to receive a data output (dout) from a device 106 and an addressable memory element of an I/O address space 428 by way of a multiplexer 438 which is controlled by a control select signal (dout_sel). The read data manipulation unit supports bit masking and shifting operations on the output data (dout) before passing the data to an upstream device as memory map read data (mm_rdata). The read address decoder 434 is coupled to receive a memory map read address (mm_raddr) and generates the dout_sel value associated with a read operation to select the particular port or shared memory of the design to perform the read transaction. Finally, the read enable generator 436 is coupled to receive a memory map read enable signal (mm_re). The read enable generator generates a capture enable signal for capturing the selected output in register 436. A read enable signal (re) is also generated according to stored enable parameters for the read transaction, as will be described in more detail below.

While data stored in an addressable memory element, such as the memory element having an address 00000002 at port "c" of Bank 0, may be accessible whenever it is available at an output register, an operation associated with a FIFO is a two part operation. That is, the read enable signal is coupled to a FIFO of device 106. The read enable generator 436 ensures that the capture signal and the read enable signal are generated at the appropriate time to read the data from the memory. Therefore, the FIFO is enabled first by the read enable signal, and the capture enable signal is generated at the appropriate time to latch the correct value at the output of the multiplexer 438.

The read enable signal is coupled to an AND gate 440 which is also coupled to receive the read mask. The read mask enables only certain registers to be read at the appropriate time. As will be described in more detail below, the write mask and the read mask enable selectively writing to or reading from the circuit element. Additional details regarding write latency and read latency will be provided below in reference to FIGS. 7-10. While the example of FIG. 4 relates to multiple memory banks receiving different enable signals coupled to addressable memory locations of the different memory banks, the embodiment of FIG. 4 could relate to any device or circuit having multiple input and output ports which are separately enabled to control the writing to and reading from the ports.

There are several types of addressable memory locations in the configurable memory map interface that are used for direct mapping, indirect mapping, and configuration. Most of the banks in the configurable memory map are for direct mapping, where the linear address is interpreted as an offset into the memory space that corresponds to a selected bank. That is, the memory address is partitioned into two parts including a bank select and a linear address representing an offset. Typically, the higher bits of the address are used for the bank select and the lower bits are used for the linear address.

Figure 5:
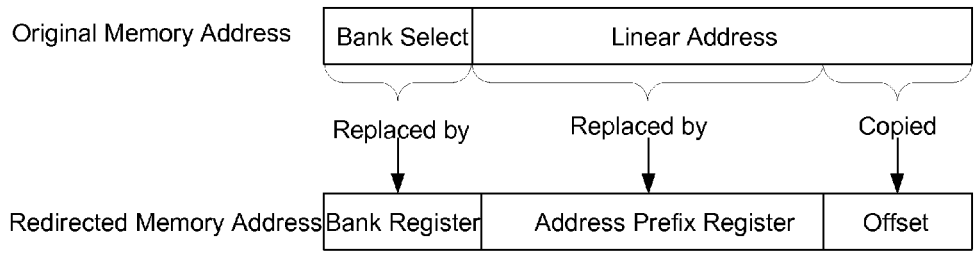
FIG. 5 is a block diagram of redirected memory address according to an embodiment of the present invention.

One or more banks may be used for indirect mapping, where the actual bank and linear address cannot be directly deduced from the memory address, but instead through the current value stored in the bank register and address prefix register, as shown in FIG. 5. Memory read and write transactions are performed differently on the banks with indirect mapping. The bank select of the original memory address is used to inform the memory map controller that an indirect mapping is used. The memory map controller uses the current value of the bank register to determine the target bank to access. It also extracts the current value of the address prefix register and combines that with the lower bits of the original memory address to determine the actual linear address. The unused higher bits of the linear address from the original memory address are used to carry special control signals or data.

Figure 6:
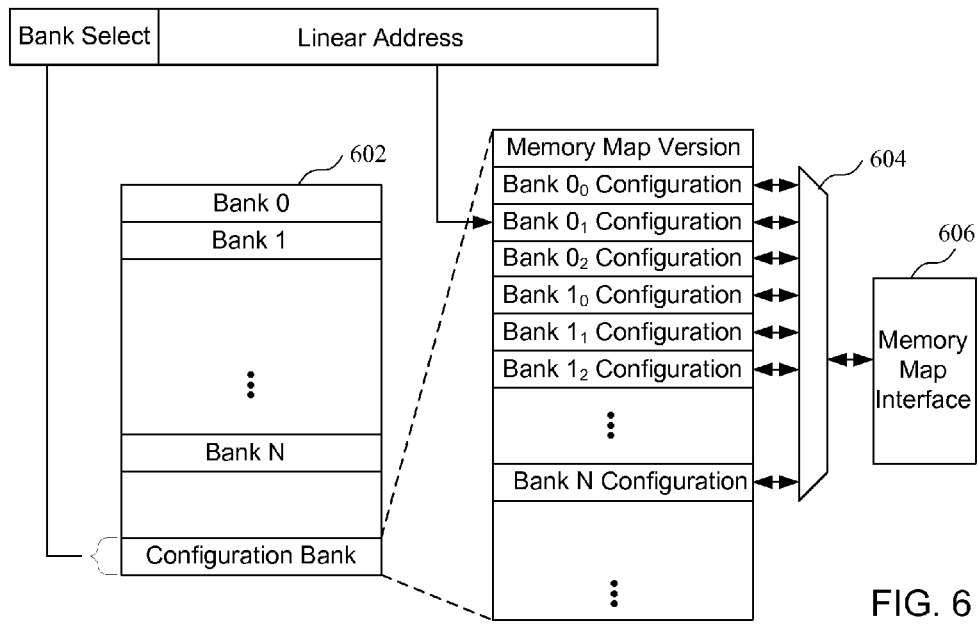
FIG. 6 is a block diagram of a portion of a configurable memory map interface comprising a configuration memory space according to an embodiment of the present invention.

As shown in FIG. 6, a configuration memory space enables loading configuration data, such as enable signal parameters and memory masking data, according to an embodiment of the present invention. The configurable memory map 602 comprises data for a memory map having a plurality of banks. That is, each of the banks (e.g. Bank 0-Bank N) comprises the registers for storing data in the addressable memory elements of the I/O address space, as described above in reference to FIG. 4. As shown in FIG. 6, one bank (e.g. the last bank) is reserved for the configuration space. The configuration registers store the read and write masks used for generating the correct read and write enable signals. The configuration registers could also store the enable signal parameters used by the memory map controller to generate the appropriate timing for the enable signals. As shown in FIG. 6, the configuration space may have more than one set of configuration data associated with a given Bank. For example, Bank 0 may be configured according to Bank $O_0$ Configuration, Bank $0_1$ Configuration, or Bank $0_2$ Configuration. As will be described in more detail below, the read and write operations for the device may be dynamically changed by selecting a different set of configuration data for a given port. While data is shown associated with a given bank, the data may be stored according to a given port. By employing a memory mapped configuration space, configurations of the configurable memory map interface may be accessed via regular memory read and write transactions, as well as dynamically changing the operation of the read and write transactions.

Unlike conventional memory map implementations for co-processing and hardware co-simulation which support only a fixed latency for all ports of a circuit element, the circuits of FIGS. 4-6 enable variable latency control of different ports of the circuit element, as well as selective addressing of ports using masks stored in the configuration space. Considering first the variable latency aspects of the circuits and methods of the present invention, an acknowledge signal as shown in FIG. 4 could be employed such that the read/write latency may vary depending on when the acknowledgement is asserted with respect to when the read/write enable is asserted. However, such an arrangement requires that every I/O port generate an acknowledge signal, which can be a waste of resources if the latency can be predetermined. Accordingly, when latency can be predetermined, enable signal parameters are stored to accommodate generating an enable signal to meet the predetermined latency. By storing enable signal parameters, the configurable memory map interface allows the initial latency, the duration of the read/write enable signal, and the read/write latency to be configured dynamically at run-time per memory location.

Further, multi-rate designs are very common in digital signal processing (DSP) applications. The flexibility of adjusting the read/write latency and the duration of read/write enable assertion allows a slave attached to the memory map to change its sampling rate dynamically. For example, a slave may be mapped to a memory location and originally samples data from the memory map on every clock cycle. The write latency and write enable duration for that location are thus set to one cycle. Later, it may be desirable to decrease the operating frequency of the slave to save power. The slave then samples data on every other cycle. Accordingly, the write latency and write enable duration is set to two cycles for the memory location to where the slave is mapped.

Figure 7:
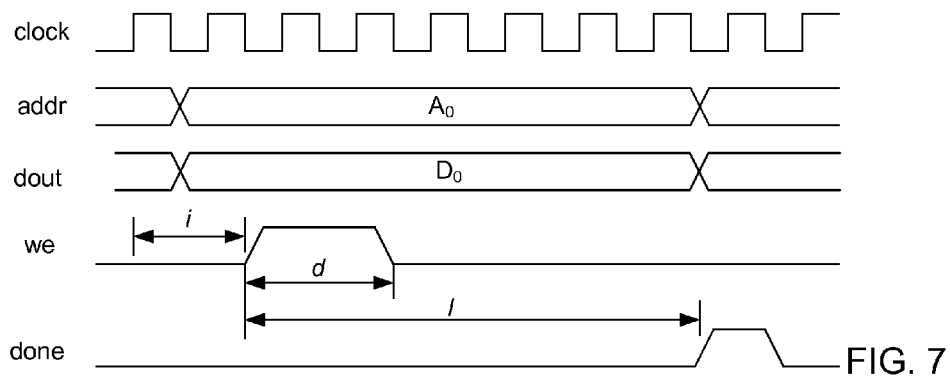
FIG. 7 is a timing diagram for a write operation according to an embodiment of the present invention.

Turning now to FIG. 7, a timing diagram for a write operation according to an embodiment of the present invention is shown. In order to support both fixed and arbitrary read/write latency, a hybrid scheme is used by the configurable memory map interface. To support fixed read/write latency, three control registers are used in the configurable memory map interface to specify the initial latency and duration of the read/write enable signal, as well as the read/write latency of a transaction associated with a memory location. These control registers allow different shapes of the read/write enable signal to be generated based on the target I/O port. For a read/write transaction, the configurable memory map waits for the initial latency "i" before asserting the read/write enable. The read/write enable remains asserted for the specified duration "d." Once the read/write enable is asserted, the configurable memory map expects the transaction to be completed after the read/write latency "l". The values of the enable signal parameters for write/read enable generation may be parameterized on a per-bank basis through the configuration space for each bank.

However, some slaves do not have a fixed read/write latency where the transaction can be completed at an arbitrary time. Accordingly, the configurable memory map interface supports an acknowledgement signal through which a slave can indicate that it is ready to consume data in a write transaction or the data is available in a read transaction. The acknowledgement signal is only used by slaves with an arbitrary read/write latency. Other slaves with a fixed read/write latency can simply tie off the acknowledgement signal.

When performing a memory write operation as illustrated in FIG. 7, valid address data to be written and a write enable signal are present at memory map controller 402. The configurable memory map dispatches the write operation to the target port of the circuit element having I/O ports, which may be for example a port of a configurable logic block or shared memory. It may take a few cycles before the data is written. Accordingly, before the data is written, another write transaction may take place if memory write operations are pipelined. Otherwise, the next write is scheduled for several cycles later according to the write latency of the port or shared memory.

Figure 8:
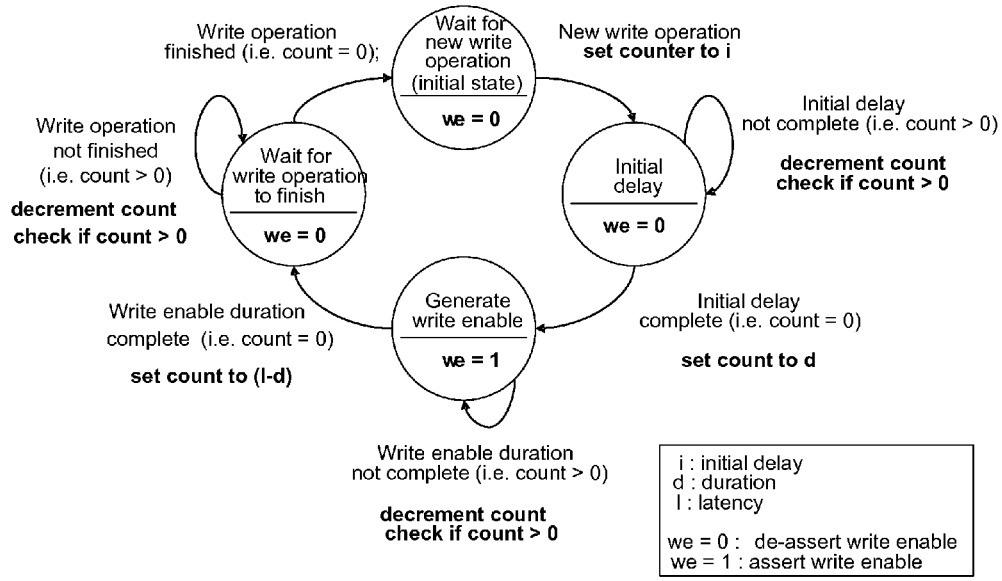
FIG. 8 is a state machine for implementing variable latency write operations according to an embodiment of the present invention.

Turning now to FIG. 8, a state machine for implementing variable latency write operations according to an embodiment of the present invention is shown. The state machine may be implemented in a processor or configurable resources coupled to receive the enable signal parameters. According to the embodiment of FIG. 8, the various enable parameters may be set by a counter. The state machine waits for a new write operation at an initial state, during which the write enable signal (we) is set to a logical "0." After a new write operation is detected, a counter is set to "i," and the state machine remains in a second state with the write enable signal maintained as a logical "0" until the initial delay is complete. When the initial delay is complete, the count is set to "d" and the state machine is moved to a third state during which a write enable is generated. Accordingly, the write enable signal is set to a logical "1" until the duration of the write enable is achieved. After the write enable signal has been held high until the count for the duration of the write enable signal has been reached, the write enable is set to a logical "0" and the state machine moves to a fourth state until the write operation is finished. That is, the count is set to a value of (l–d). After the count of "l–d" is reached and the write operation is finished, the state machine returns to the initial state.

Figure 9:
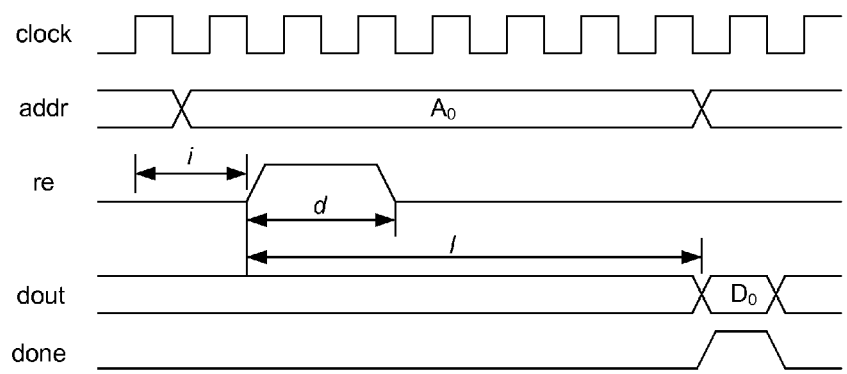
FIG. 9 is a timing diagram for a read operation according to an embodiment of the present invention.

Turning now to FIG. 9, a timing diagram for a read operation according to an embodiment the present invention is shown. When performing a read operation, a valid address is present at the memory map controller 402 followed by the assertion of the memory map read enable signal. The configurable memory map then dispatches the requested read to the circuit element. The output port of the circuit element returns a valid result at a later moment which is present as the memory map read data. The time between when the address is present and the read enable is asserted and when the output data becomes available is the read latency of the output port. Depending on the design, the read latency can vary from zero clock cycle to an arbitrary number of cycles which may differ among addresses or may change from time to time for the same address. Sometimes there are additional requirements such as that the read enable signal may only be asserted several cycles after the address is present, or that the read enable signal must remain for a few cycles once asserted. Accordingly, the values of the initial latency "l", the duration "d" and the transaction latency "l" are set for a read operation according to known or desired values for a given access to the device 106.

Figure 10:
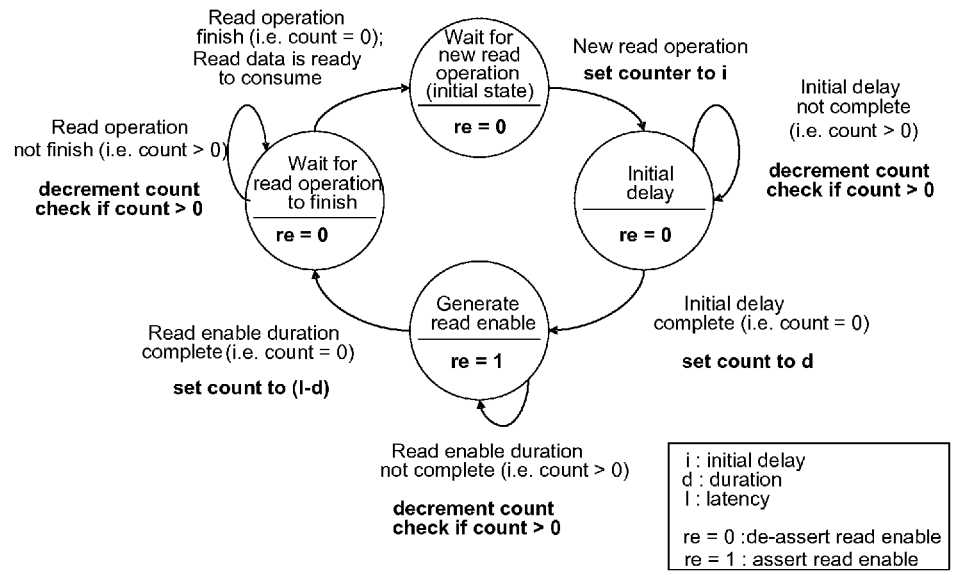
FIG. 10 is a state machine for implementing variable latency read operations according to an embodiment of the present invention.

Turning now to FIG. 10, a state machine for implementing variable latency read operations according to an embodiment of the present invention is shown. The state machine operates similar to the state machine of FIG. 8, and waits for a new read operation at an initial state, during which the read enable signal (re) is set to a logical "0." After a new read operation is detected, the counter is set to "i," and the state machine remains in a second state with the read enable signal maintained as a logical "0" until the initial delay is complete. When the initial delay is complete, the count is set to "d" and the state machine is moved to a third state during which a read enable is generated. Accordingly, the read enable signal is set to a logical "1" until the duration of the read enable is achieved when the count has reached "d." After the read enable signal has been held high until the count for the duration of the read enable signal has been reached, the read enable is set to a logical "0" and the state machine moves to a fourth state until the read operation is finished and the read data is ready to be consumed. That is, the count is set to a value of (l–d). After the count of "l–d" is reached and the read operation is finished, the state machine returns to the first state. As described above with respect to FIG. 4 regarding reading data from a FIFO, the read enable of FIG. 10 would correspond to a FIFO read enable signal, where the capture signal generated to the register 436 could be generated when the data is ready to be consumed after the third state.

Another challenge in memory map implementations is to handle data width mismatches. Memory map interfaces usually adopt a fixed data width which is the natural word size of the hardware co-simulation interface or the processor. For example, the natural word size could be 32 bits. However, the device being memory mapped may have a different word size, such as 1-bit, 32-bit, or 72-bit. Thus, a width conversion is required. While a simple scheme using loose packing enables, for example, a 1-bit port of a device to be mapped to a 32-bit memory location, this scheme is not suitable for designs with many narrow ports as the memory space may be exhausted quickly. Alternatively, a compact packing scheme tries to pack multiple narrow ports into one memory location. While this conserves memory space, the reduced memory space requirement is done at the cost of additional hardware resources as well as more complicated address decoding logic and read/write transactions.

According to embodiments of the present invention, data manipulation such as bit masking enables compact packing of ports into the same memory location for better utilization of the memory space. In many DSP and multi-media, video and image processing (MVI) applications, the processor is used as a controller to control the data flow. Usually, the control interface is realized using a number of 1-bit and a few bit registers, commonly called thin registers. Since the processor inherently handles 32-bit or 64-bit data, mapping thin registers to different memory locations associated with the processor wastes the limited memory space of the processor. More importantly, the address decoding logic may become unnecessarily big and inefficient. One solution is to combine multiple thin registers and map them to the same memory location. However, unless the memory map interface supports masking, writing to some of the thin registers without affecting the others requires a readback before writing. Read-back is usually an expensive operation. In the case of concurrent memory access by multiple processors or bus masters (e.g., direct memory access (DMA) engines), the read-back may keep a stale copy of the thin registers. Accordingly, unexpected effects may result when the stale values are written back to the registers. The configurable memory map interface supports mapping multiple thin registers to the same location. Masking is realized using the configurable read/write enable signals, so that the processor can efficiently access all or a subset of these registers simultaneously.

For DSP and MVI applications, the processor may need to access some shared memory blocks efficiently. One example is a video analytical engine, where data of the selected frames needs to be passed to the processor for analysis. To improve the operating frequencies of the shared memory blocks on critical paths, output registering can be applied to shared memory blocks. On the other hand, for shared memory blocks that are not critical paths, little or no output registering can be used so as to reduce the access latency and the hardware resource usage. The disclosed configurable memory map interface can be used to accommodate the different access latencies of shared memory blocks by assigning shared memory blocks to different banks and allowing different banks to have different read/write enable signal patterns.

Figure 11:
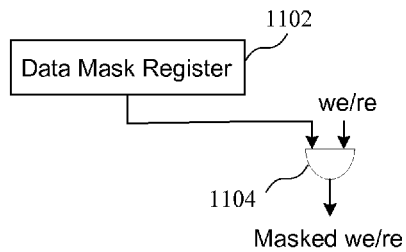
FIG. 11 is a block diagram showing a masking operation according to an embodiment of the present invention.

Turning now to FIG. 11, a block diagram shows a masking operation according to an embodiment of the present invention. The configurable memory map interface according to the various embodiments supports data manipulation units to accommodate several kinds of read/write transaction that would otherwise require multiple read/write transactions to achieve the same result (which can result in a long latency or turnaround time) or disallow compact packing of ports into the same memory location (which can result in inefficient memory space utilization). According to one embodiment, the data manipulation unit enables bit masking. With bit masking, a write/read transaction can update/retrieve only a subset of bits at a memory location. Bit masking is useful for memory locations that may have mapped several narrow ports. Bit masking comprises passing or blocking a given read enable or write enable bit based upon a value stored in the mask. For example, each read enable or write enable bit could be separately coupled to an AND gate which is also coupled to receive a mask bit. Without bit masking, a write transaction may require an additional read to retrieve the current value of those unconcerned ports in order to preserve their value during the write transaction, or it may require the design to have similar masking capabilities to prevent those unconcerned ports from being read if the read is intrusive or causes side effects.

Figure 12:
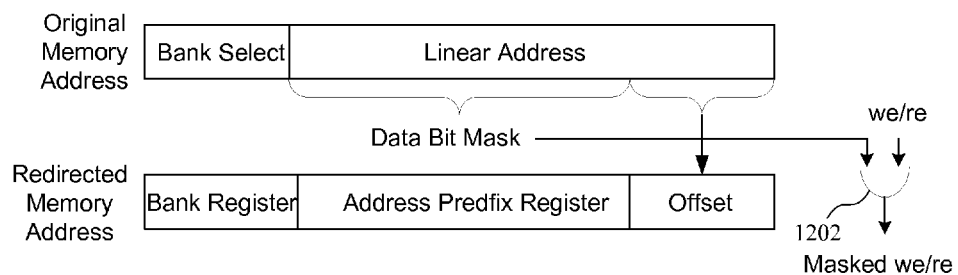
FIG. 12 is a block diagram showing a masking operation according to an alternate embodiment of the present invention.

One way of implementing bit masking in a configurable memory map interface requires a data mask register to hold the current mask value which is used to mask off the read/write enable of a subset or bits of a port during a read/write transaction, as shown in FIG. 11. That is, a value of a data mask register 1102 is coupled to an input of an AND gate 1104, which is also coupled to receive a write enable or read enable signal. A value of a Bank or one or more ports of a Bank may be used to enable corresponding write enable and read enable signals. Alternatively, indirect mapping may be as shown in FIG. 12, where the bit mask is provided as part of the linear address portion of the original memory address. An upstream device may decide to use either mechanism depending on the memory access pattern and which technique involves fewer updates on the control registers and therefore lower latency. As set forth above in reference to FIG. 4, the value of the data mask register is stored in the configuration space and can be optionally parameterized on a per bank basis.

Figure 13:
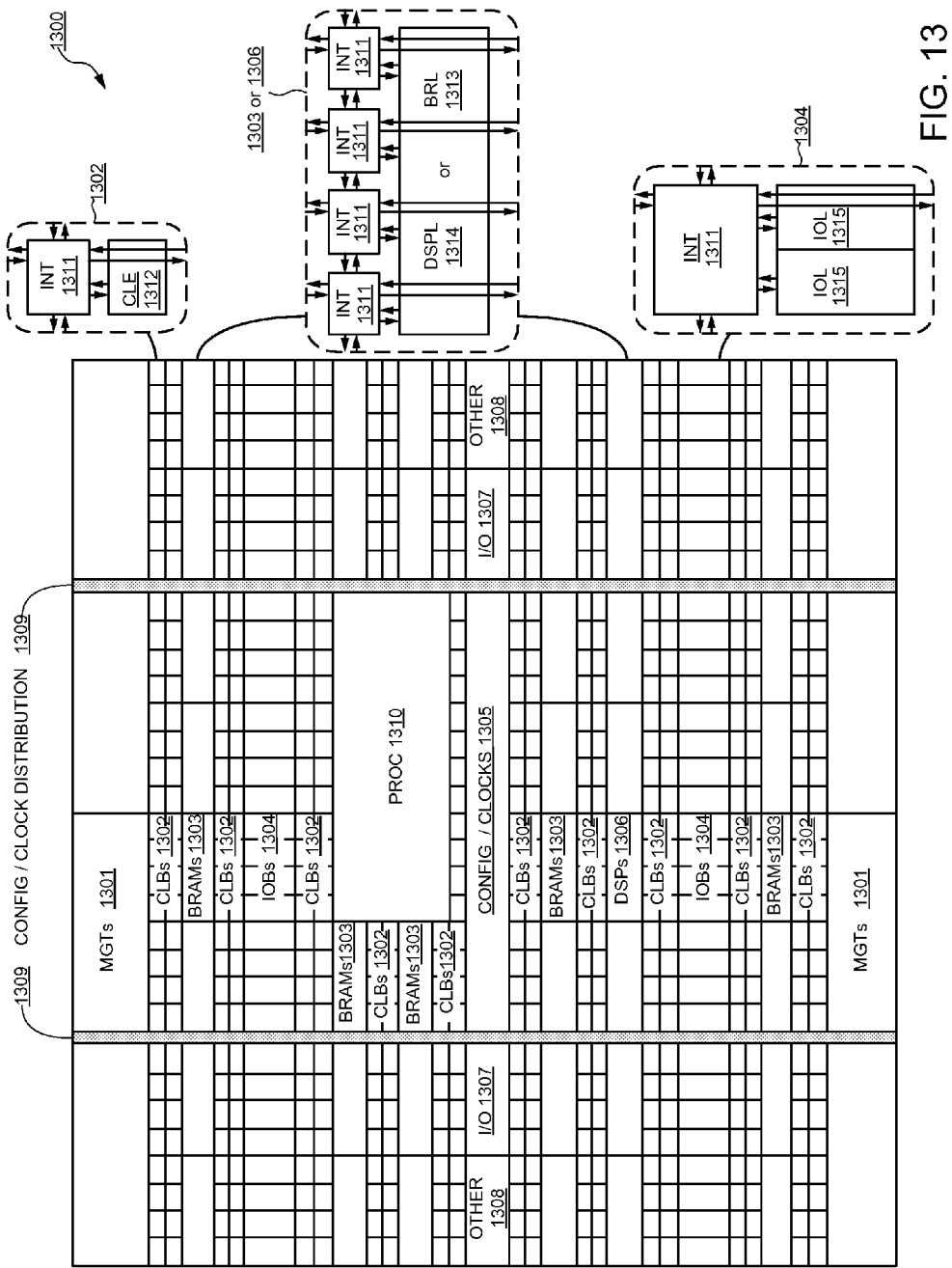
FIG. 13 is a block diagram of a device having configurable resources according to an embodiment of the present invention.

Turning now to FIG. 13, a block diagram of a device having configurable resources according to an embodiment of the present invention is shown. The circuits and methods of the present invention as described above with respect to FIGS. 1-12 may be implemented in the circuit of FIG. 13. For example, the circuit of FIG. 4 may be implemented in configurable logic elements of the circuit of FIG. 13, where the memory map controller may be implemented in a soft processor or a dedicated processor and the device 106 may comprise one or more configurable logic elements implementing a circuit or a memory. While devices having configurable resources may be implemented in any type of integrated circuit device, such as an application specific integrated circuit (ASIC) having programmable logic, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration bitstream comprises information stored in memory banks, as well as for implementing configurable resources. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 13 comprises an FPGA architecture 1300 having a large number of different programmable tiles including multi-gigabit transceivers (MGTs) 1301, CLBs 1302, random access memory blocks (BRAMs) 1303, input/output blocks (IOBs) 1304, configuration and clocking logic (CONFIG/CLOCKS) 1305, digital signal processing blocks (DSPs) 1306, specialized input/output blocks (I/O) 1307 (e.g., configuration ports and clock ports), and other programmable logic 1308 such as digital clock managers, analog-to-digital converters, system monitoring logic, and so forth. Some FPGAs also include dedicated processor blocks (PROC) 1310.

In some FPGAs, each programmable tile includes a programmable interconnect element (INT) 1311 having standardized connections to and from a corresponding interconnect element in each adjacent tile. Therefore, the programmable interconnect elements taken together implement the programmable interconnect structure for the illustrated FPGA. The programmable interconnect element 1311 also includes the connections to and from the programmable logic element within the same tile, as shown by the examples included at the top of FIG. 13.

For example, a CLB 1302 may include a configurable logic element (CLE) 1312 that may be programmed to implement user logic plus a single programmable interconnect element 1311. A BRAM 1303 may include a BRAM logic element (BRL) 1313 in addition to one or more programmable interconnect elements. The BRAM comprises dedicated memory separate from the distributed RAM of a configuration logic block. Typically, the number of interconnect elements included in a tile depends on the width of the tile. In the pictured embodiment, a BRAM tile has the same width as four CLBs, but other numbers (e.g., five) may also be used. A DSP tile 1306 may include a DSP logic element (DSPL) 1314 in addition to an appropriate number of programmable interconnect elements. An IOB 1304 may include, for example, two instances of an input/output logic element (IOL) 1315 in addition to one instance of the programmable interconnect element 1311. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a horizontal area near the center of the die is used for configuration, clock, and other control logic. Vertical areas 1309 extending from this horizontal area are used to distribute the clocks and configuration signals across the height of the FPGA. Some FPGAs utilizing the architecture illustrated in FIG. 13 include additional logic blocks that disrupt the regular row structure making up a large part of the FPGA. The additional logic blocks may be programmable blocks and/or dedicated logic. For example, the processor block PROC 1310 shown in FIG. 13 spans several rows of CLBs and BRAMs.

Note that FIG. 13 is intended to illustrate only an exemplary FPGA architecture. The numbers of logic blocks in a row, the relative widths of the rows, the number and order of rows, the types of logic blocks included in the rows, the relative sizes of the logic blocks, and the interconnect/logic implementations included at the top of FIG. 13 are purely exemplary. For example, in an actual FPGA more than one adjacent row of CLBs is typically included wherever the CLBs appear, to facilitate the efficient implementation of user logic.

Figure 14:
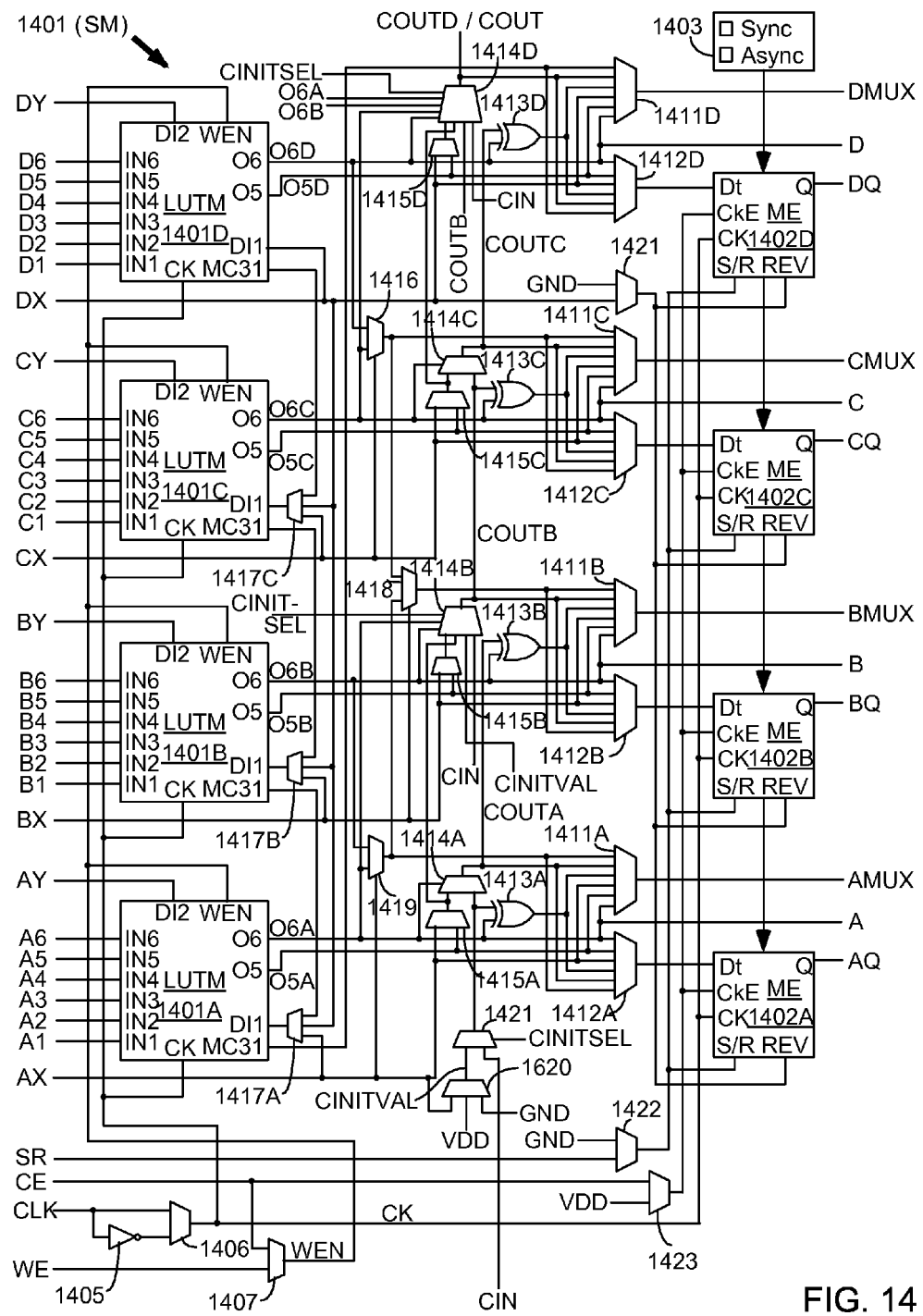
FIG. 14 is a block diagram of a configurable logic element of the device of FIG. 13 according to an embodiment of the present invention.

Turning now to FIG. 14, a block diagram of a configurable logic element of the device of FIG. 13 according to an embodiment the present invention is shown. In particular, FIG. 14 illustrates in simplified form a configurable logic element of a configuration logic block 1302 of FIG. 13. In the embodiment of FIG. 14, slice M 1401 includes four lookup tables (LUTMs) 1401A-1401D, each driven by six LUT data input terminals A1-A6, B1-B6, C1-C6, and D1-D6 and each providing two LUT output signals O5 and O6. The O6 output terminals from LUTs 1401A-1401D drive slice output terminals A-D, respectively. The LUT data input signals are supplied by the FPGA interconnect structure via input multiplexers, which may be implemented by programmable interconnect element 1311, and the LUT output signals are also supplied to the interconnect structure. Slice M also includes: output select multiplexers 1411A-1411D driving output terminals AMUX-DMUX; multiplexers 1412A-1412D driving the data input terminals of memory elements 1402A-1402D; combinational multiplexers 1416, 1418, and 1419; bounce multiplexer circuits 1422-1423; a circuit represented by inverter 1405 and multiplexer 1406 (which together provide an optional inversion on the input clock path); and carry logic comprising multiplexers 1414A-1414D, 1415A-1415D, 1420-1421 and exclusive OR gates 1413A-1413D. All of these elements are coupled together as shown in FIG. 14. Where select inputs are not shown for the multiplexers illustrated in FIG. 14, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 14 for clarity, as well as from other selected figures herein.

In the pictured embodiment, each memory element 1402A-1402D may be programmed to function as a synchronous or asynchronous flip-flop or latch. The selection between synchronous and asynchronous functionality is made for all four memory elements in a slice by programming Sync/Asynch selection circuit 1403. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1402A-1402D are clocked by a clock signal CK, which may be provided by a global clock network or by the interconnect structure, for example. Such programmable memory elements are well known in the art of FPGA design. Each memory element 1402A-1402D provides a registered output signal AQ-DQ to the interconnect structure. Because each LUT 1401A-1401D provides two output signals, O5 and O6, the LUT may be configured to function as two 5-input LUTs with five shared input signals (IN1-IN5), or as one 6-input LUT having input signals IN1-IN6.

In the embodiment of FIG. 14, each LUTM 1401A-1401D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1417A-1417C for LUTs 1401A-1401C), or to the two 32-bit RAMs via input terminals DI1 and DI2. RAM write operations in the LUT RAMs are controlled by clock signal CK from multiplexer 1406 and by write enable signal WEN from multiplexer 1407, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1401A may also be provided to the general interconnect structure for shift register chaining, via output select multiplexer 1411D and CLE output terminal DMUX.

Turning now to FIGS. 15-20, flow charts shows various methods of implementing a configurable memory map interface. The methods of FIGS. 15-20 may be implemented using any of circuits as described in the embodiments of FIGS. 1-14, or other suitable circuits. While specific steps are described in reference to a particular method, it should be understood these steps or additional steps may be performed according to the disclosure of FIGS. 1-14 or another of the methods in FIGS. 15-20. Referring first to FIG. 15, a flow chart shows a method of implementing a memory map interface according to an embodiment of the present invention. Control signals associated with a memory map interface for controlling reading from or writing to the circuit element having input/output ports are stored at a step 1502. The control signals may be, for example, enable signal parameters or read/write masks. An address is received at an input of the configurable memory map interface, where the address enables reading from or writing to the circuit element at a step 1504. A first enable signal is generated for reading from or writing to the circuit element at a step 1506. New control signals are dynamically accessed at a step 1508. A second enable signal is generated based upon the new control signals for reading from or writing to the circuit element at a step 1510, where the second enable signal has different timing characteristics than the first enable signal and the first enable signal and the second enable signal are used to access the same port.

Turning now to FIG. 16, a flow chart shows a method of implementing a memory map interface according to an alternate embodiment of the present invention. Control signals associated with a configurable memory map interface for controlling reading from or writing to the circuit element having input/output ports, such as enable signal parameters or read/write masks, are stored at a step 1602. It is then determined whether an access command, such as a read request or a write request, is received for accessing the circuit element at a step 1604. If not, the method waits for an access command. When an access command is received, the appropriate control signals are then loaded at a step 1606. Access to the circuit element is enabled according to the control signals at a step 1608. It is then determined whether another access is required at a step 1610. If so, the appropriate control signals are loaded at the step 1606. Otherwise, the method waits for another access command.

Figure 17:
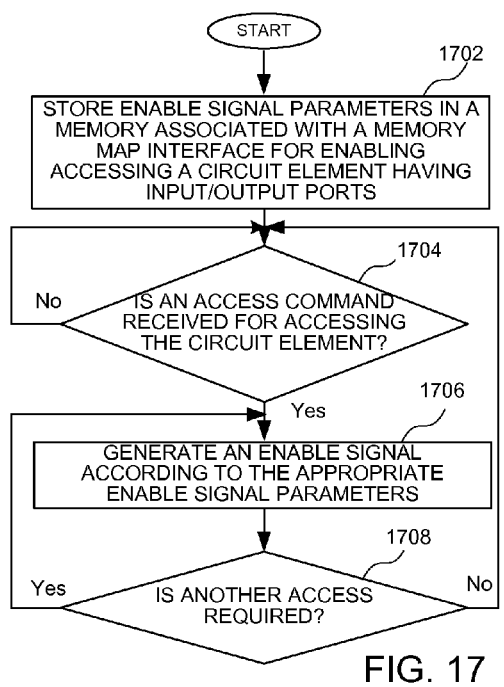
FIG. 17 is a flow chart showing a method of generating enable signals in a configurable memory map interface according to an embodiment of the present invention.

Turning now to FIG. 17, a flow chart shows a method of generating enable signals in a memory map interface according to an embodiment of the present invention. Enable signal parameters, such as the initial latency, duration, and transaction latency set forth above, are stored in a memory associated with a memory map interface for enabling accessing a circuit element having input/output ports at a step 1702. It is then determined whether an access command is received for accessing the circuit element at a step 1704. When an access command is received, an enable signal is generated according to the appropriate enable signal parameters at a step 1706. It is then determined whether another access is required at a step 1708. If another access is required, an enable signal is generated at the step 1706. The access may be based upon the same enable signal parameters or different enable signal parameters. Otherwise, the method waits for another access command to be received at the step 1704.

Figure 18:
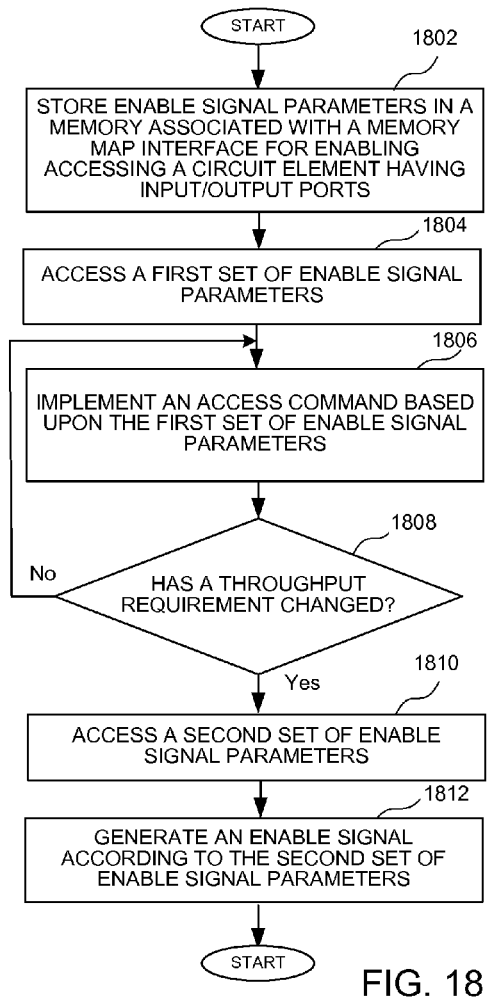
FIG. 18 is a flow chart showing a method of enabling a throughput change when implementing a configurable memory map interface according to an embodiment of the present invention.

Turning now to FIG. 18, a flow chart shows a method of enabling a throughput change when implementing a memory map interface according to an embodiment of the present invention. Enable signal parameters are stored in a memory associated with a memory map interface for enabling accessing a circuit element having input/output ports at a step 1802. A first set of enable signal parameters are accessed at a step 1804. An access command based upon the first set of enable signal parameters is implemented at a step 1806. It is then determined whether a throughput requirement has changed at a step 1808. If so, a second set of enable signal parameters are accessed at a step 1810. An enable signal is generated according to the second set of enable signal parameters at a step 1812.

Figure 19:
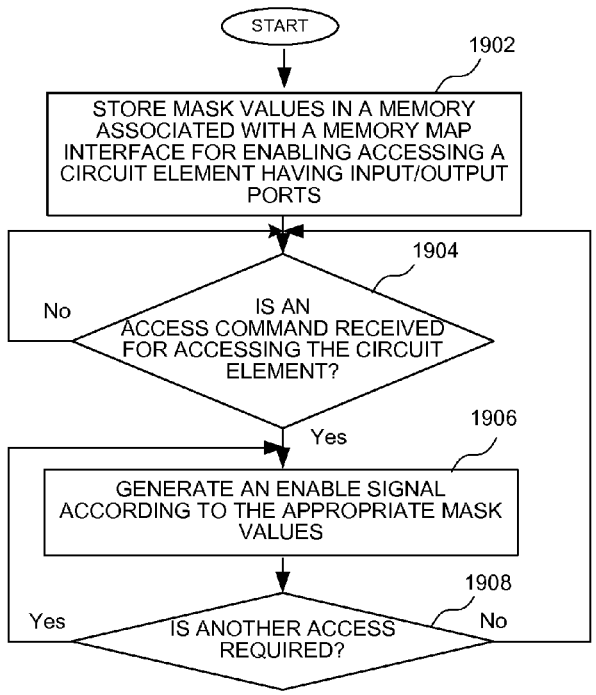
FIG. 19 is a flow chart showing a method of generating masked enable signals when implementing a configurable memory map interface according to an embodiment of the present invention.

Turning now to FIG. 19, a flow chart shows a method of generating masked enable signals when implementing a memory map interface according to an embodiment of the present invention. Mask values are stored in a memory associated with a memory map interface for enabling accessing a circuit element having input/output ports at a step 1902. It is then determined whether an access command is received for accessing the circuit element at a step 1904. If so, an enable signal is generated according to the appropriate mask values at a step 1906. It is then determined whether another access is required at a step 1908. If another access is required, an enable signal is generated at the step 1906. Otherwise, the method waits for another access command to be received at the step 1904.

Figure 20:
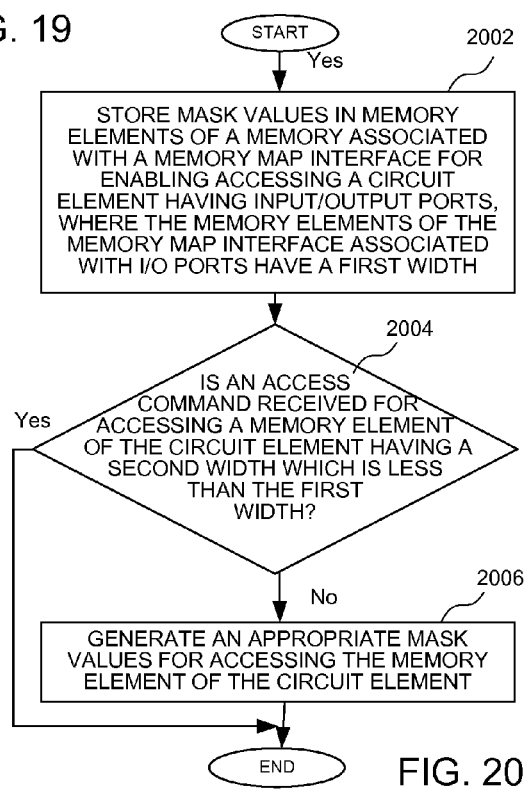
FIG. 20 is a flow chart showing a method of implementing a configurable memory map interface for mapping wide registers to thin registers according to an embodiment of the present invention.

Finally, turning to FIG. 20, a flow chart shows a method of implementing a memory map interface for mapping wide registers of a memory map interface to thin registers of a device according to an embodiment the present invention. Mask values are stored in memory elements of a memory associated with the memory map interface for enabling accessing a circuit element having input/output ports at a step 2002, where addressable memory elements associated with the input/output ports have a first width. It is then determined whether an access command is received for accessing a memory element of the circuit element having a second width which is less than the first width at a step 2004. Appropriate mask values are generated for accessing the memory element of the circuit element at a step 2006. That is, masks are generated as necessary to prevent incorrectly writing over data or inadvertently altering data when reading data which does not need to be read.

It can therefore be appreciated that the new and novel configurable memory map interface and method of implementing a configurable memory map interface has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A configurable memory map interface coupled to a circuit element having input/output ports, the configurable memory map interface comprising:
    an input coupled to receive an address enabling reading from or writing to the circuit element;
    a memory storing enable signal parameters, the enable signal parameters controlling timing of first enable signals for the reading from or the writing to the circuit element;
    an enable signal generator generating the first enable signals enabling the reading from or the writing to the circuit element based upon the enable signal parameters stored in the memory; and
    an address decoder coupled to receive the address and generate second enable signals, the first enable signals and the second enable signals enabling predetermined input/output ports.

2. The configurable memory map interface of claim 1 further comprising memory elements associated with the predetermined input/output ports, the memory elements coupling input data to the predetermined input/output ports.

3. The configurable memory map interface of claim 2 wherein the first enable signals and the second enable signals comprise enable signals controlling the memory elements associated with the predetermined input/output ports.

4. The configurable memory map interface of claim 1 wherein the enable signal parameters comprise at least one parameter from the group consisting of an initial latency, a duration, and a transaction latency.

5. The configurable memory map interface of claim 1 wherein the enable signal generator comprises a state machine generating an enable signal of the first enable signals based upon an initial latency, a duration, and a transaction latency.

6. The configurable memory map interface of claim 5 wherein the state machine comprises a first state machine for writing data and a second state machine for reading data.

7. The configurable memory map interface of claim 1 further comprising masked enable signals.

8. A configurable memory map interface coupled to a circuit element having input/output ports, the configurable memory map interface comprising:
    an input coupled to receive an address enabling reading from or writing to the circuit element;
    a first memory storing a mask, the mask controlling the reading from or the writing to the circuit element;
    a second memory storing enable signal parameters, the enable signal parameters controlling timing of second enable signals; and
    an enable signal generator generating an enable signal of the second enable signals enabling the reading from or the writing to the circuit element based upon the mask stored in the first memory and the enable signal parameters stored in the second memory.

9. The configurable memory map interface of claim 8 wherein the mask controls write enable signals for coupling data from the configurable memory map interface to the circuit element.

10. The configurable memory map interface of claim 8 wherein the mask controls read enable signals for coupling data from the circuit element to the configurable memory map interface.

11. The configurable memory map interface of claim 10 wherein the configurable memory map interface comprises an input/output address portion, and wherein the second memory comprises a configuration portion controlling the input/output address portion.

12. The configurable memory map interface of claim 11 wherein memory elements of input/output address portion have a first width and memory elements of the circuit element have a second width, wherein the first width is greater than the second width.

13. The configurable memory map interface of claim 11 wherein the circuit element comprises a plurality of memory banks, the configuration portion storing a plurality of masks corresponding to the plurality of memory banks.

14. A method of coupling a configurable memory map interface to a circuit element having input/output ports, the method comprising:
 storing control signals for controlling reading from or writing to the circuit element;
 receiving an address at an input, the address identifying an input/output port of the circuit element for the reading from or the writing to the circuit element;
 generating a first enable signal based upon the address received at the input;
 generating a second enable signal for reading from or writing to the input/output port of the circuit element;
 reading from or writing to the circuit element based upon the first enable signal and the second enable signal;
 dynamically accessing new control signals; and
 generating a third enable signal based upon the new control signals for reading from or writing to the input/output port of the circuit element.

15. The method of claim 14 wherein generating a second enable signal and generating a third enable signal comprise generating enable signals according to stored enable signal parameters for reading from or writing to the circuit element.

16. The method of claim 14 wherein generating a second enable signal and a third enable signal comprise generating enable signals according to stored parameters associated with at least one of an initial latency, a duration, and a transaction latency.

17. The method of claim 14 wherein generating a second enable signal and generating a third enable signal comprise generating enable signals associated with a corresponding first memory bank and a corresponding second memory bank.

18. The method of claim 14 wherein generating a second enable signal and generating a third enable signal comprise generating enable signals associated with memory elements of the configurable memory map interface having a first width which is greater than a second width of memory elements of the circuit element.

19. The method of claim 14 wherein generating a second enable signal and generating a third enable signal comprise generating masked enable signals.

\* \* \* \* \*